US010553710B2

(12) United States Patent
Ogura et al.

(10) Patent No.: US 10,553,710 B2
(45) Date of Patent: Feb. 4, 2020

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Tsuneo Ogura, Kamakura Kanagawa (JP); Tomoko Matsudai, Shibuya Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/837,453

(22) Filed: Dec. 11, 2017

(65) Prior Publication Data
US 2018/0342604 A1 Nov. 29, 2018

(30) Foreign Application Priority Data

May 24, 2017 (JP) .................... 2017-102542

(51) Int. Cl.
*H01L 29/739* (2006.01)
*H01L 29/78* (2006.01)
(Continued)

(52) U.S. Cl.
CPC ........ *H01L 29/7397* (2013.01); *H01L 23/535* (2013.01); *H01L 29/1083* (2013.01); *H01L 29/4236* (2013.01); *H01L 29/4238* (2013.01); *H01L 29/7813* (2013.01); *H01L 29/4916* (2013.01)

(58) Field of Classification Search
CPC ............ H01L 29/7397; H01L 23/535; H01L 29/1083; H01L 29/4236; H01L 29/4238; H01L 29/7813; H01L 29/66734; H01L 29/66666; H01L 29/7828; H01L 29/407; H01L 29/7811; H01L 29/42372;
(Continued)

(56) References Cited

U.S. PATENT DOCUMENTS 6,639,275 B2   10/2003  Ninomiya
6,798,018 B2    9/2004  Takaishi et al.
(Continued)

FOREIGN PATENT DOCUMENTS

JP   2002-368221 A   12/2002
JP   2002-373988 A   12/2002
JP   2007-273931 A   10/2007

*Primary Examiner* — Mouloucoulaye Inoussa
(74) *Attorney, Agent, or Firm* — White & Case LLP

(57) ABSTRACT

According to one embodiment, a semiconductor device includes a first electrode, a second electrode, a semiconductor layer provided between the first electrode and the second electrode, a plurality of gate electrodes provided in the semiconductor layer and extending in a first direction, a plurality of gate interconnects provided in the semiconductor layer and connected with the gate electrodes, the gate interconnects extending in a second direction crossing the first direction, an insulating film provided between the gate electrodes and the semiconductor layer, and between the gate interconnects and the semiconductor layer, and an inter-layer insulating film provided between the gate electrodes and the second electrode, and between the gate interconnects and the second electrode.

17 Claims, 7 Drawing Sheets

(51) Int. Cl.
*H01L 23/535* (2006.01)
*H01L 29/10* (2006.01)
*H01L 29/423* (2006.01)
*H01L 29/49* (2006.01)

(58) Field of Classification Search
CPC .......... H01L 29/42376; H01L 29/1095; H01L 29/1608; H01L 29/4916; H01L 29/51
USPC .................. 257/330, 355, E29.001; 438/270
See application file for complete search history.

(56) References Cited

U.S. PATENT DOCUMENTS

| | | | |
|---|---|---|---|
| 7,772,641 B2 | 8/2010 | Omura et al. | |
| 2003/0071305 A1* | 4/2003 | Matsudai | H01L 29/1095 257/329 |
| 2009/0032875 A1* | 2/2009 | Kawaguchi | H01L 29/7813 257/355 |
| 2012/0012861 A1* | 1/2012 | Nakano | H01L 29/1095 257/77 |
| 2012/0248532 A1* | 10/2012 | Lu | H01L 29/0696 257/334 |
| 2013/0240947 A1* | 9/2013 | Matsudai | H01L 29/7395 257/139 |
| 2015/0270387 A1* | 9/2015 | Kumada | H01L 29/7397 257/140 |
| 2015/0295043 A1* | 10/2015 | Takeda | H01L 29/0696 257/139 |
| 2016/0027906 A1* | 1/2016 | Onozawa | H01L 29/66348 257/144 |
| 2017/0263754 A1* | 9/2017 | Soeno | H01L 29/0619 |

* cited by examiner

A–A'

B–B'

C–C'

D–D'

SEMICONDUCTOR DEVICE

CROSS-REFERENCE TO RELATED APPLICATION

This application is based upon and claims the benefit of priority from Japanese Patent Application No. 2017-102542, filed on May 24, 2017; the entire contents of which are incorporated herein by reference.

FIELD

Embodiments described herein relate generally to a semiconductor device.

BACKGROUND

In recent years, an IGBT (Insulated Gate Bipolar Transistor) has been widely used as a power semiconductor device having a breakdown voltage of 600 V or more. Since this power semiconductor device is generally used as a switch, it is desired to be low in on-voltage and fast in switching speed. In addition to this, it is especially desired to have higher reliability as a high-voltage and large-current switch.

DETAILED DESCRIPTION

Figure 1:
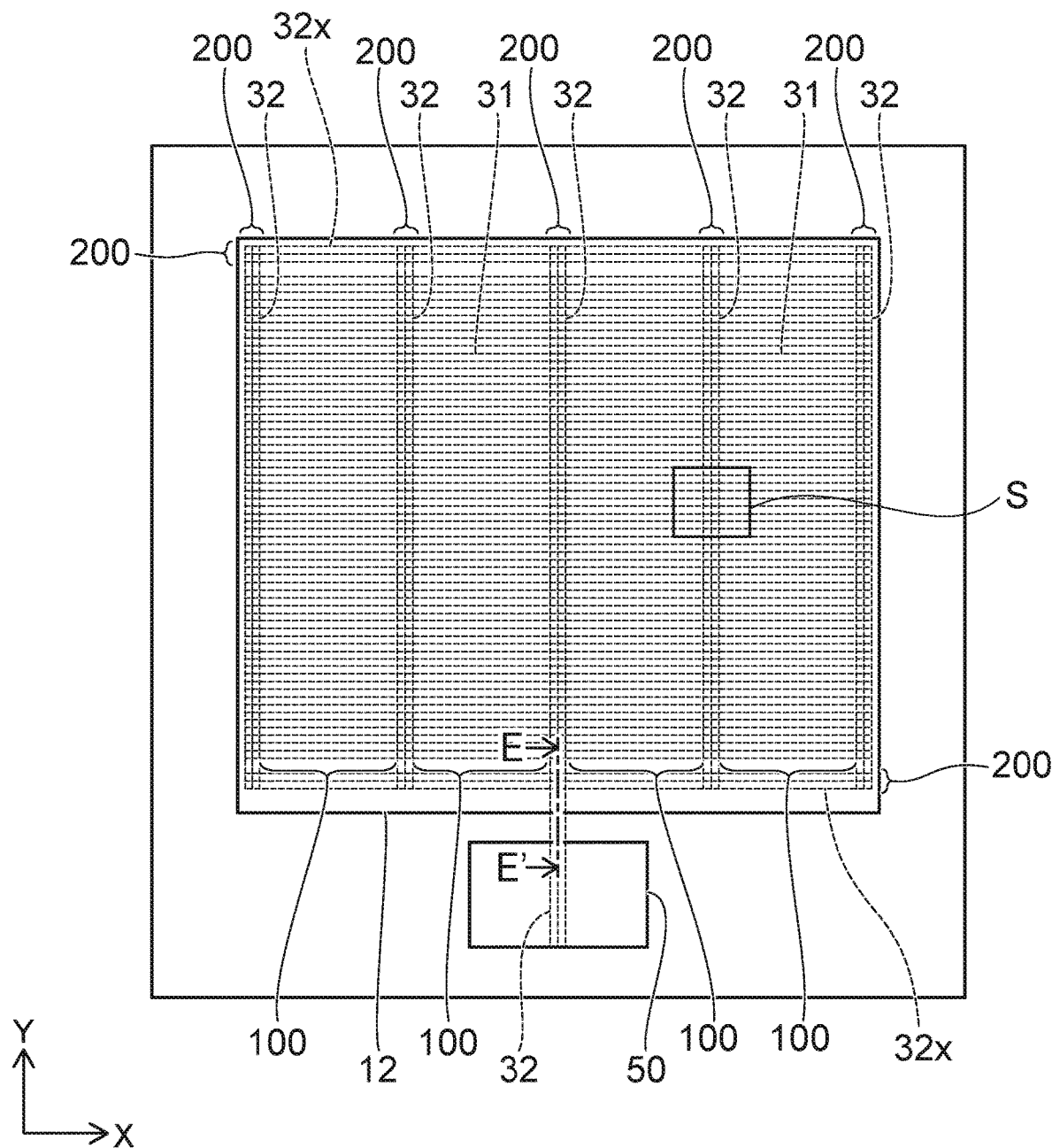
FIG. 1 is a schematic plan view of a semiconductor device of an embodiment.

According to one embodiment, a semiconductor device includes a first electrode, a second electrode, a semiconductor layer provided between the first electrode and the second electrode, a plurality of gate electrodes provided in the semiconductor layer and extending in a first direction, a plurality of gate interconnects provided in the semiconductor layer and connected with the gate electrodes, the gate interconnects extending in a second direction crossing the first direction, an insulating film provided between the gate electrodes and the semiconductor layer, and between the gate interconnects and the semiconductor layer, and an inter-layer insulating film provided between the gate electrodes and the second electrode, and between the gate interconnects and the second electrode. The semiconductor layer includes a first semiconductor layer provided on the first electrode, a second semiconductor layer of a first conductivity type provided on the first semiconductor layer, a third semiconductor layer of a second conductivity type provided on the second semiconductor layer, and a fourth semiconductor layer of the first conductivity type provided on the third semiconductor layer and connected with the second electrode.

Hereinafter, embodiments will be described with reference to the drawings. Incidentally, in the respective drawings, the same components are denoted by the same reference numerals.

Although, in the following embodiment, a first conductivity type is described as n-type and a second conductivity type is described as p-type, the first conductivity type may be p-type and the second conductivity type may be n-type.

Moreover, although a semiconductor material is silicon in the embodiment, the semiconductor material is not limited to silicon and may be, for example, silicon carbide, gallium nitride, gallium oxide, or the like.

FIG. 1 is a schematic plan view of a semiconductor device (semiconductor chip) without the second electrode of the embodiment.

Figure 2:
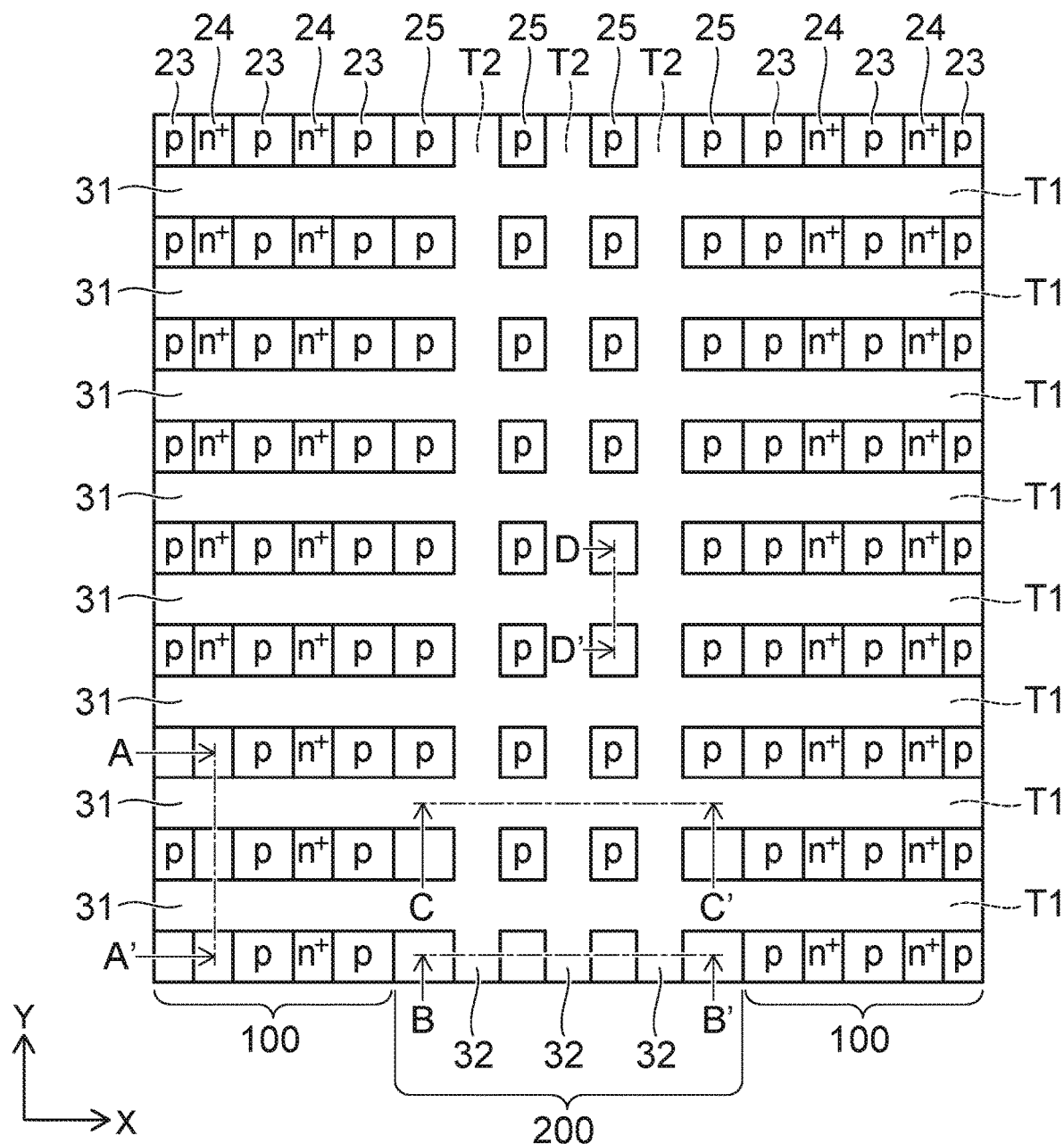
FIG. 2 is an enlarged plan view of a partial area S in FIG. 1.

FIG. 2 is an enlarged plan view of a partial area S in FIG. 1.

Figure 3:
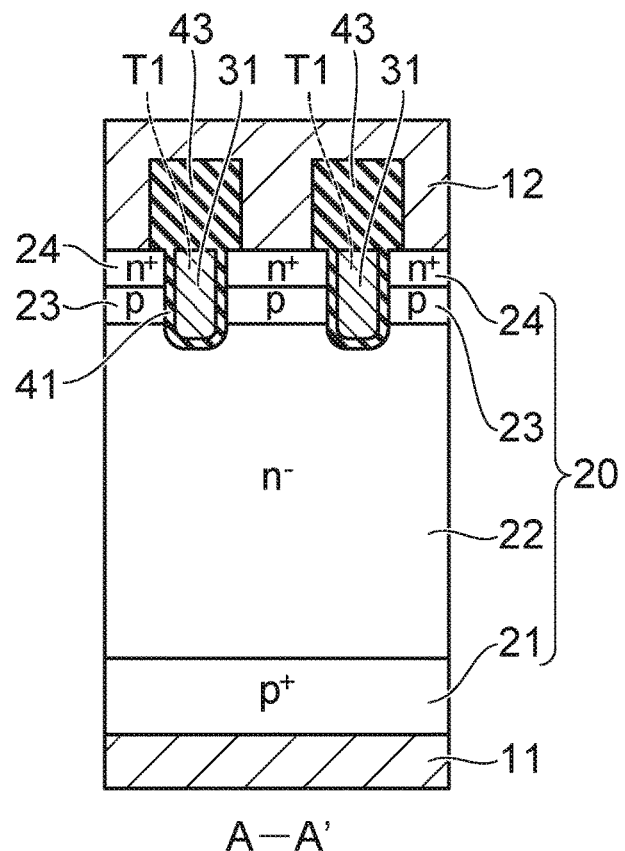
FIG. 3 is a sectional view taken along line A-A' in FIG. 2.

FIG. 3 is a sectional view taken along line A-A' in FIG. 2.

The semiconductor device of the embodiment is a device with a vertical IGBT structure in which a semiconductor layer 20 is provided between a collector electrode 11 as a first electrode and an emitter electrode 12 as a second electrode and a current flows in a direction (vertical direction) connecting the collector electrode 11 with the emitter electrode 12.

Alternatively, the semiconductor device may be a device with a MOSFET (Metal Oxide Semiconductor Field Effect Transistor) structure in which a layer 21 of a $p^+$-type to be described below is replaced with a layer of an $n^+$-type.

The semiconductor layer 20 is a silicon layer doped with an impurity. As shown in FIG. 3, the semiconductor layer 20 includes the collector layer (first semiconductor layer) 21 of the $p^+$-type, a base layer or drift layer (second semiconductor layer) 22 of an $n^-$-type, a base layer (third semiconductor layer) 23 of the p-type, and an emitter layer (fourth semiconductor layer) 24 of an $n^+$-type.

The p-type impurity concentration of the collector layer 21 is generally higher than the p-type impurity concentration of the p-type base layer 23. Moreover, the n-type impurity concentration of the emitter layer 24 is generally higher than the n-type impurity concentration of the $n^-$-type base layer 22.

The collector layer 21 is provided on the collector electrode 11 and is in contact with the collector electrode 11. The $n^-$-type base layer 22 is provided on the collector layer 21. The p-type base layer 23 is provided on the $n^-$-type base layer 22. The emitter layer 24 is provided on the p-type base layer 23.

As shown in FIG. 2, a plurality of the emitter layers 24 is selectively formed separated from each other in the X-direction on the surface of the p-type base layer 23, and extends in the Y-direction. The X-direction and the Y-direction show directions orthogonal to each other in a plane parallel to the major surface of the semiconductor layer 20.

The semiconductor device of the embodiment includes gate electrodes 31 with a trench gate structure. As shown in FIG. 3, the gate electrodes 31 are provided in the semiconductor layer 20. An insulating film 41 is provided between the side surface of the gate electrode 31 and the semiconductor layer 20 and between the bottom of the gate electrode 31 and the semiconductor layer 20. The insulating film 41 is, for example, a silicon oxide film.

The insulating film 41 is formed on the inner wall of a trench T1 formed on the side of the surface of the semiconductor layer 20 by, for example, a thermal oxidation method, and polycrystalline silicon, for example, is buried as the gate electrode 31 inside the insulating film 41.

As shown in FIG. 1 and FIG. 2, the plurality of gate electrodes 31 extends in the X-direction and is separated from each other in the Y-direction.

As shown in FIG. 3, the gate electrode 31 pierces the emitter layer 24 and the p-type base layer 23 to reach the nrn-type base layer 22. The lower end of the gate electrode 31 is located lower (the side of the collector layer 21) than the bottom (a p-n junction between the p-type base layer 23 and the n⁻-type base layer 22) of the p-type base layer 23. The side surface of the gate electrode 31 is opposed to the emitter layer 24 and the p-type base layer 23 via the insulating film 41.

An inter-layer insulating film 43 is provided on the gate electrode 31. The inter-layer insulating film 43 is, for example, a silicon oxide film. The emitter electrode 12 is provided on the emitter layer 24 so as to cover the inter-layer insulating film 43. The emitter electrode 12 is in contact with the emitter layer 24.

Moreover, the emitter electrode 12 is also in contact with the surface of the p-type base layer 23 in an area where the emitter layer 24 is not formed (an area between the emitter layers 24 separated in the X-direction in FIG. 2).

As shown in FIG. 1, the emitter electrode 12 is sometimes not divided into a plurality of emitter electrodes, but one emitter electrode 12 per chip is formed occupying most of the upper surface of the chip. The plurality of gate electrodes 31 extends in the X-direction below the emitter electrode 12.

Also a plurality of gate interconnects 32 is disposed in the semiconductor layer 20 below the emitter electrode 12. As shown in FIG. 2, in a gate interconnect area where the plurality of gate interconnects 32 is disposed, the emitter layer 24 and the p-type base layer 23 are not provided, but a p-type semiconductor layer (fifth semiconductor layer) 25 is provided.

Figure 4:
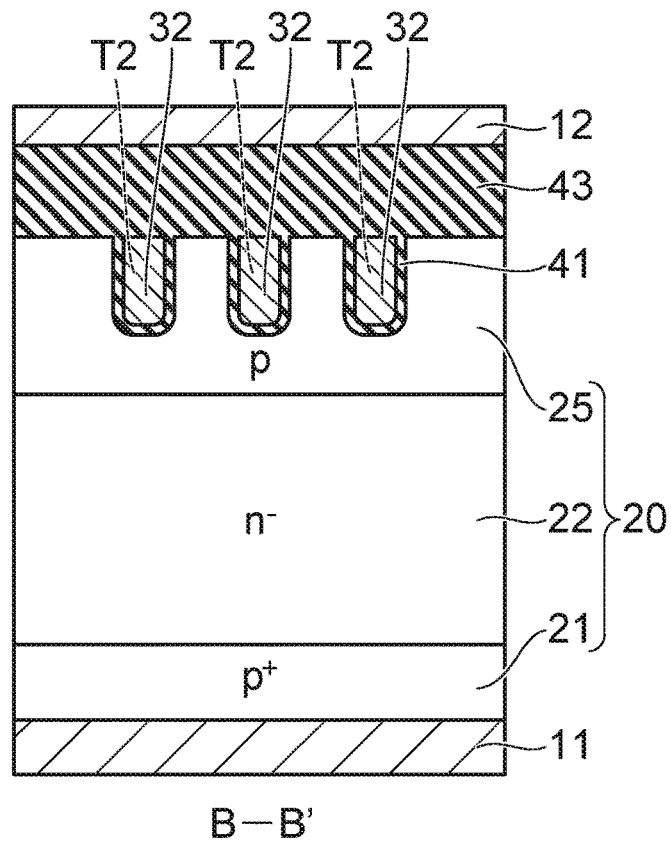
FIG. 4 is a sectional view taken along line B-B' in FIG. 2.

FIG. 4 is a sectional view taken along line B-B' in FIG. 2.

Figure 5:
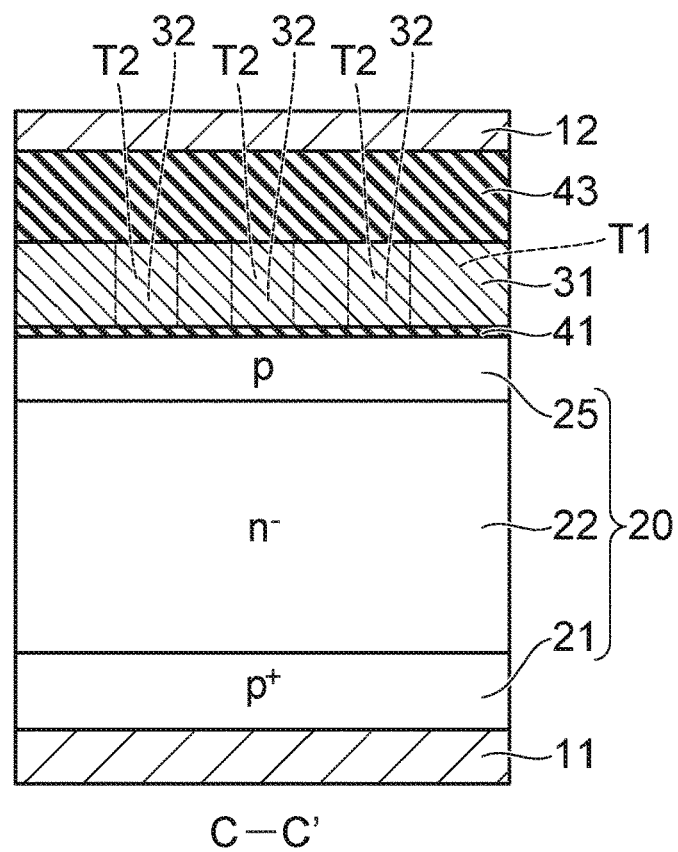
FIG. 5 is a sectional view taken along line C-C' in FIG. 2.

FIG. 5 is a sectional view taken along line C-C' in FIG. 2.

Figure 6:
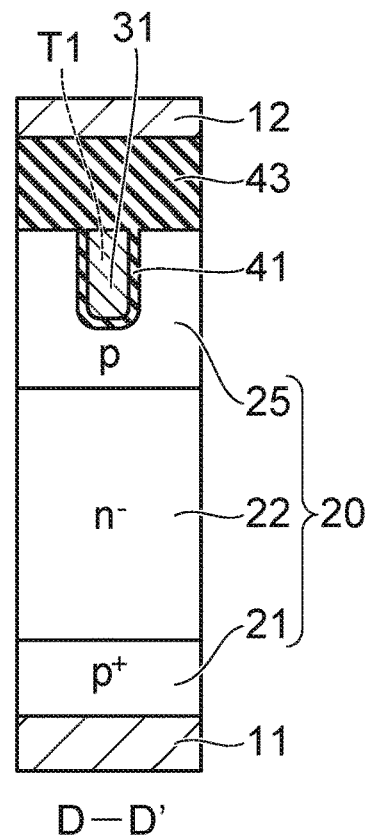
FIG. 6 is a sectional view taken along line D-D' in FIG. 2.

FIG. 6 is a sectional view taken along line D-D' in FIG. 2.

As shown in FIG. 4, the gate interconnect 32 is buried in a trench T2 formed in the semiconductor layer 20, via the insulating film 41, similarly to the gate electrode 31. As shown in FIG. 2, a plurality of the trenches T2 extends in the Y-direction and is separated from each other in the X-direction. Hence, the plurality of gate interconnects 32 extends in the Y-direction and is separated from each other in the X-direction.

The trench T1 and the trench T2 are generally simultaneously formed by, for example, a RIE (Reactive Ion Etching) method. The trench T1 and the trench T2 cross (e.g., are orthogonal to) each other. The width of the trench T1 and the width of the trench T2 are substantially equal, and the depth of the trench T1 and the depth of the trench T2 are substantially equal. However, the width and the depth of the trench T1 and the trench T2 are not necessarily limited to equal.

After the insulating film 41 is formed on the inner walls of the trenches T1 and T2, polycrystalline silicon, for example, is buried as the material of the gate electrode 31 and the gate interconnect 32 in the trenches T1 and T2. Hence, the gate electrode 31 and the gate interconnect 32 are integrally provided using the same material and cross (e.g., are orthogonal to) each other. At the crossing portion, the gate electrode 31 and the gate interconnect 32 are integrally connected.

The width of the gate electrode 31 and the width of the gate interconnect 32 are substantially equal and are each, for example, approximately 1 μm. The depth of the gate electrode 31 and the depth of the gate interconnect 32 are substantially equal and are each, for example, approximately 5 μm. However, the width and the depth of the gate electrode 31 and the gate interconnect 32 are not necessarily limited to equal.

The bottom of the p-type semiconductor layer 25, shown in FIG. 4, provided in the gate interconnect area where the plurality of gate interconnects 32 is disposed is located at a position (the side of the collector layer 21) deeper than the bottom of the p-type base layer 23 in a cell area shown in FIG. 3. As shown in FIG. 4, the p-type semiconductor layer 25 covers the corners of the bottom of the gate interconnect 32 via the insulating film 41. The insulating film 41 is provided between the gate interconnect 32 and the p-type semiconductor layer 25.

The p-type semiconductor layer 25 is electrically connected with the emitter electrode 12. Alternatively, the p-type semiconductor layer 25 may be electrically floating. The p-type semiconductor layer 25 relaxes an electric field at the corners of the bottom of the gate interconnect 32 with a trench structure where an electric field tends to concentrate.

As shown in FIG. 5 and FIG. 6, the p-type semiconductor layer 25 is provided also below a portion crossing the gate interconnect area in the X-direction where the plurality of gate interconnects 32 is disposed in the gate electrode 31.

As shown in FIG. 4, the emitter electrode 12 spreads also above the gate interconnects 32, and the inter-layer insulating film 43 is provided between the emitter electrode 12 and the gate interconnects 32.

As shown in FIG. 1, the number of the plurality of gate electrodes 31 is larger than the number of the plurality of gate interconnects 32. The area S shown in FIG. 2 is repeated in the X-direction and the Y-direction in one chip.

That is, the cell area 100 where the p-type base layers 23 and the emitter layers 24 are disposed and the gate interconnect area 200 where the p-type semiconductor layer 25 and the plurality of gate interconnects 32 are disposed are alternately arranged in the X-direction. As shown in FIG. 1, a plurality of the gate interconnect areas 200 is disposed separated from each other in the X-direction. The area of the cell area 100 (the length thereof in the X-direction) is larger than the area of the gate interconnect area 200 (the length thereof in the X-direction).

The number of the gate interconnect areas 200 may be one. For example, only one gate interconnect area 200 that is disposed in the middle in a chip horizontal direction (the X-direction) and extends in the Y-direction in FIG. 1 may suffice in case of small chip.

Moreover, gate interconnect areas 200 that extend in the X-direction so as to connect the plurality of gate interconnect areas 200 extending in the Y-direction are formed. In the example shown in FIG. 1, the gate interconnect areas 200 extending in the X-direction are disposed at both ends in the Y-direction.

The gate interconnect area 200 extending in the X-direction includes a plurality of outer peripheral gate interconnects 32x extending in the X-direction. The plurality of outer peripheral gate interconnects 32x is separated from each other in the Y-direction. Also the outer peripheral gate interconnect 32x is formed of, for example, polycrystalline silicon buried in a trench formed in the semiconductor layer 20 similarly to the gate interconnect 32 or the gate electrode 31. Both ends of the plurality of gate interconnects 32 extending in the Y-direction are connected to the outer peripheral gate interconnects 32x extending in the X-direction. The plurality of gate interconnects 32 and the plurality of outer peripheral gate interconnects 32x surround an area where the plurality of gate electrodes 31 is disposed.

As shown in FIG. 1, a gate pad 50 is provided on the upper surface of the chip. The gate pad 50 is disposed separated from the emitter electrode 12 in an area where the emitter electrode 12 is not formed on the chip upper surface. The area of the gate pad 50 is smaller than the area of the emitter electrode 12. The emitter electrode 12 and the gate pad 50 are both made of a metal material and made of, for example, aluminum.

Figure 7:
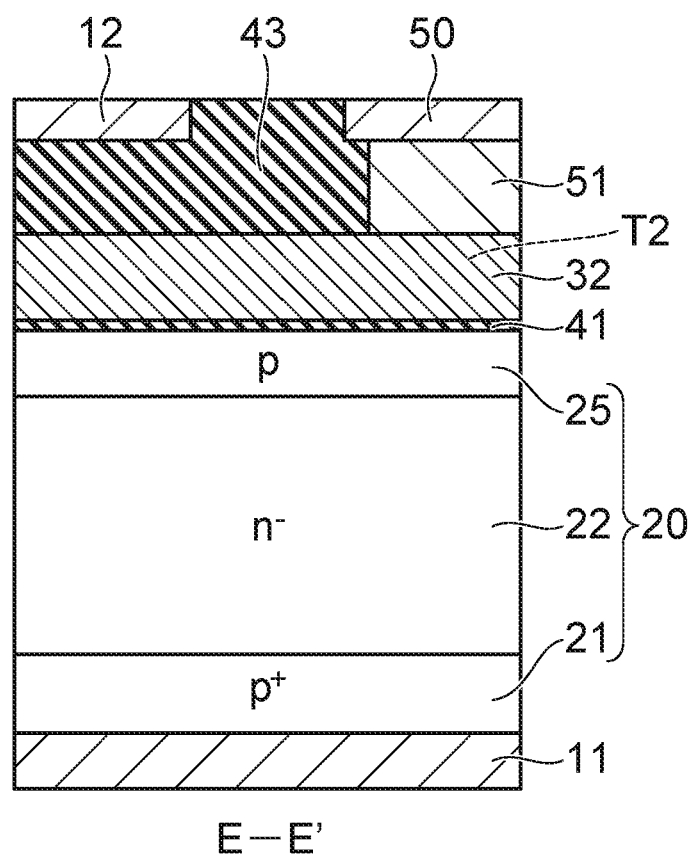
FIG. 7 is a sectional view taken along line E-E' in FIG. 1.

FIG. 7 is a sectional view taken along line E-E' in FIG. 1.

As shown in FIG. 1, the plurality of gate interconnects 32 extending in the Y-direction is electrically connected to the plurality of gate interconnects 32x extending in the X-direction, and the plurality of gate interconnects 32 in the gate interconnect area 200 located in, for example, the middle in the X-direction also extends in an area below the gate pad 50. The gate pad 50 is disposed above end portions of the gate interconnects 32 in the Y-direction. As shown in FIG. 7, a through electrode 51 is provided between the gate interconnects 32 and the gate pad 50. The through electrode 51 connects the gate pad 50 with the gate interconnects 32. Due to this, the gate pad 50 is electrically connected to all of the gate electrodes 31 in the chip via the gate interconnects 32 and the gate interconnects 32x, and can supply a gate signal.

The emitter electrode 12 and the gate pad 50 are disposed substantially at the same height. The inter-layer insulating film 43 is provided between the emitter electrode 12 and the gate pad 50.

The gate electrode 31 is electrically connected with the gate pad 50 through the gate interconnects 32 and 32x and the through electrode 51. For example, a wire is bonded to the gate pad 50, and the gate pad 50 is connected with an external circuit through the wire.

Alternatively, the through electrode 51 may be extended in the X-direction in FIG. 1, and each of the gate interconnects 32 in the plurality of gate interconnect areas 200 extending in the Y-direction may be connected to the through electrode 51. Due to this, the gate pad 50 is electrically connected to all of the gate electrodes 31 in the chip with a lower resistance and can supply a gate signal, and an element operation more improved in balance is possible.

For example, a plate-like connector is joined onto the emitter electrode 12, and the emitter electrode 12 is connected with the external circuit through the connector. The collector electrode 11 is joined onto a lead frame.

In the IGBT described above, a voltage is applied between the collector electrode 11 and the emitter electrode 12. A potential applied to the collector electrode 11 is higher than a potential applied to the emitter electrode 12.

During an on-operation of the IGBT, a potential at a threshold or more is applied to the gate electrode 31, and an inversion layer (a channel of the n-type) is formed in an area opposed to the gate electrode 31 in the p-type base layer 23. Then, an electron current flows between the collector electrode 11 and the emitter electrode 12 through the collector layer 21, the $n^-$-type base layer 22, the channel, and the emitter layer 24. At this time, holes are supplied from the collector layer 21 to the $n^-$-type base layer 22, a high density state of electrons and holes is produced in the $n^-$-type base layer 22, and a low on-resistance is obtained.

In an IGBT with a trench gate structure, a structure in which a gate interconnect of metal disposed substantially at the same height as emitter electrodes on a chip upper surface extends between the plurality of divided emitter electrodes to be connected to a gate pad is widely used at present. A portion of polycrystalline silicon of a trench gate is extracted upward to be connected with the metal gate interconnect.

In the structure in which the emitter electrode and the metal gate interconnect are formed substantially at the same height on the chip upper surface as described above, reliability in terms of electrical insulation may become a problem. Moreover, in the case of a structure in which a gate interconnect is covered with an insulating film of polyimide or the like and a metal electrode is formed on the entire surface of an emitter electrode forming area of a chip upper surface by a plating method or the like, there is concern for the problem of degradation of the polyimide insulating film due to a long-term high-temperature operation.

According to the embodiment, the gate interconnect 32 is formed not in the emitter electrode forming area of the chip upper surface but in the semiconductor layer 20 similarly to the gate electrode 31, and the metal gate interconnect is not formed on the chip upper surface. As a result of this, it is possible to provide an IGBT element having sufficient insulation reliability even in a long-term high-temperature operation.

Figure 9:
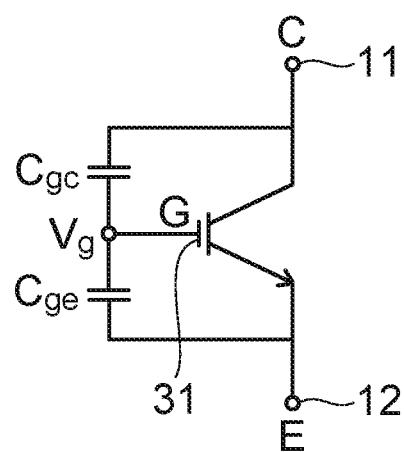
FIG. 9 is a circuit diagram of an IGBT.

FIG. 9 is a circuit diagram of the IGBT.

A capacitance Cgc exists between the collector electrode 11 and the gate electrode 31, and a capacitance Cge exists between the emitter electrode 12 and the gate electrode 31.

In a structure in which the gate interconnect 32 is divided into a plurality of gate interconnects as in the embodiment, Cge becomes larger than that of a wide gate interconnect structure (a comparative example) in which the plurality of gate interconnects 32 is connected in the X-direction without dividing them. This is due to the fact that a large capacitive component is formed between the plurality of gate interconnects 32 shown in FIG. 4 and the p-type semiconductor layer 25 at the same potential as an emitter potential. Hence, in the embodiment, Cgc/Cge can be made smaller than that of the comparative example. Making Cgc/Cge smaller stabilizes a gate potential Vg, which makes it possible to prevent false triggering in response to an external voltage change.

Moreover, in the simultaneous formation of a trench for a gate electrode and a trench for a gate interconnect by a RIE method, when there is a large difference in width between the trenches, the depth or shape of the trench tends to vary. This may lead to device characteristic fluctuation.

In contrast to this, according to the embodiment, the width of the trench T1 for the gate electrode 31 and the width of the trench T2 for the gate interconnect 32 are substantially equal. Therefore, in the simultaneous formation of the trench T1 and the trench T2 by a RIE method, variations in the depth or shape of the trenches T1 and T2 can be suppressed.

Figure 8A:
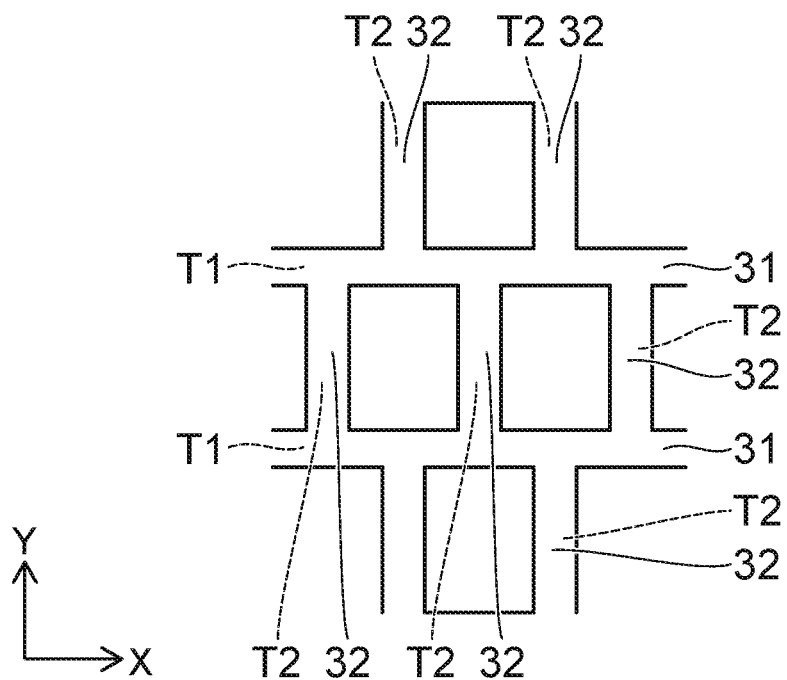
FIGS. 8A and 8B are schematic plan views showing other examples of a connection layout of a gate electrode and a gate interconnect of the embodiment.
Figure 8B:
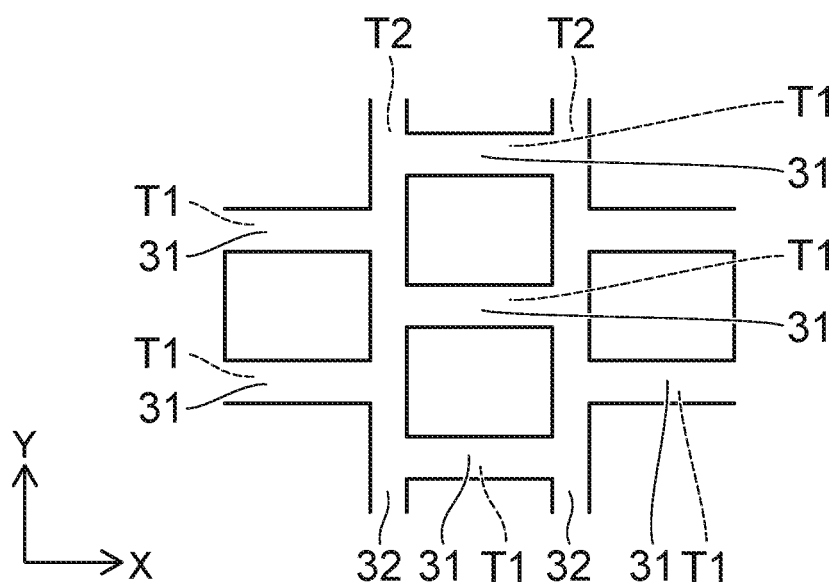

FIGS. 8A and 8B are schematic plan views showing other examples of a connection layout of the gate electrode 31 and the gate interconnect 32.

In FIG. 8A, the trench T1 (the gate electrode 31) extends in a straight line in the X-direction. In contrast to this, in the plurality of trenches T2 (the gate interconnects 32) connected to a common trench T1 (the gate electrode 31), the plurality of trenches T2 (the gate interconnects 32) connected to the side of one side surface of the common trench T1 (the gate electrode 31) and the plurality of trenches T2

(the gate interconnects 32) connected to the side of the other side surface are shifted in position in the X-direction.

In FIG. 8B, the trench T2 (the gate interconnect 32) extends in a straight line in the Y-direction. In contrast to this, in the plurality of trenches T1 (the gate electrodes 31) connected to a common trench T2 (the gate interconnect 32), the plurality of trenches T1 (the gate electrodes 31) connected to the side of one side surface of the common trench T2 (the gate interconnect 32) and the plurality of trenches T1 (the gate electrodes 31) connected to the side of the other side surface are shifted in position in the Y-direction.

In both cases of FIGS. 8A and 8B, the trench T1 (the gate electrode 31) and the trench T2 (the gate interconnect 32) are connected in a T-shape.

In a layout in which the trench T1 and the trench T2 are connected in a cross shape as shown in FIG. 2, an area to be etched spreads in four directions as viewed from the center of a connection portion (crossing portion) of the trench T1 and the trench T2.

In contrast to this, in the layout in which the trench T1 and the trench T2 are connected in a T-shape as shown in FIGS. 8A and 8B, an area to be etched spreads in three directions as viewed from the center of a connection portion (crossing portion) of the trench T1 and the trench T2. When the trench T1 and the trench T2 are simultaneously etched, a portion not etched can be less likely to be left in the vicinity of the center of the crossing portion in the T-shaped crossing portion than in the cross-shaped crossing portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a first electrode;
a second electrode;
a semiconductor layer provided between the first electrode and the second electrode;
a plurality of gate electrodes provided in the semiconductor layer and extending in a first direction;
a plurality of gate interconnects provided in the semiconductor layer and connected with the gate electrodes in the semiconductor layer, the gate interconnects extending continuously in a second direction crossing the first direction;
an insulating film provided between the gate electrodes and the semiconductor layer, and between the gate interconnects and the semiconductor layer; and
an inter-layer insulating film provided between the gate electrodes and the second electrode, and between the gate interconnects and the second electrode,
the semiconductor layer including
a first semiconductor layer provided on the first electrode,
a second semiconductor layer of a first conductivity type provided on the first semiconductor layer,
a third semiconductor layer of a second conductivity type provided on the second semiconductor layer,
a fourth semiconductor layer of the first conductivity type provided on the third semiconductor layer and connected with the second electrode, the fourth semiconductor layer being adjacent to the gate electrodes in the second direction with the insulating film interposed, the fourth semiconductor layer being disposed between the gate electrodes in the second direction, and the fourth semiconductor layer not being adjacent to the gate interconnects in the first and second directions, and
a fifth semiconductor layer of the second conductivity type provided at a position deeper than bottoms of the gate interconnects in a gate interconnect area where the gate interconnects are disposed, the gate interconnects provided only in the fifth semiconductor layer and not provided on the fifth semiconductor layer.

2. The device according to claim 1, further comprising:
a gate pad provided above the gate interconnects; and
a through electrode provided between the gate pad and the gate interconnects, and connecting the gate pad with the gate interconnects.

3. The device according to claim 2, wherein
the gate pad is disposed above an end portion of the gate interconnects in the second direction in an area not overlapping the second electrode.

4. The device according to claim 1, wherein
the fifth semiconductor layer covers corners of the bottoms of the gate interconnects with the insulating film interposed.

5. The device according to claim 1, wherein
the fifth semiconductor layer is electrically connected with the second electrode.

6. The device according to claim 1, wherein
a number of the gate electrodes is larger than a number of the gate interconnects.

7. The device according to claim 1, wherein
the gate electrodes and the gate interconnects are integrally provided using a same material.

8. The device according to claim 7, wherein
materials of the gate electrodes and the gate interconnects are silicon.

9. The device according to claim 1, wherein
a width of one of the gate electrodes and a width of one of the gate interconnects are substantially equal.

10. The device according to claim 1, wherein
a depth of one of the gate electrodes and a depth of one of the gate interconnects are substantially equal.

11. The device according to claim 1, wherein
a plurality of gate interconnect areas are disposed separated in the first direction, each of the gate interconnect areas including the plurality of gate interconnects.

12. The device according to claim 1, wherein
the first semiconductor layer is of the second conductivity type.

13. The device according to claim 1, wherein
one of the gate electrodes and one of the gate interconnects are connected in a T-shape.

14. The device according to claim 1, wherein
one second electrode that is not divided is provided above an area where the plurality of gate electrodes are disposed.

15. The device according to claim 1, further comprising a plurality of outer peripheral gate interconnects provided in the semiconductor layer outside an area where the plurality of gate electrodes are disposed, the outer peripheral gate interconnects extending in the first direction and connected with the gate interconnects.

16. The device according to claim 15, wherein
the gate interconnects and the outer peripheral gate interconnects surround the area where the gate electrodes are disposed.
17. The device according to claim 2, wherein
the second electrode and the gate pad are disposed substantially at a same height.

* * * * *